United States Patent [19]
Sano

[11] Patent Number: 5,559,446
[45] Date of Patent: Sep. 24, 1996

[54] PROBING METHOD AND DEVICE

[75] Inventor: Kunio Sano, Showa-Cho, Japan

[73] Assignees: Tokyo Electron Kabushiki Kaisha, Tokyo; Tokyo Electron Yamanashi Kabushiki Kaisha, Yamanashi-Ken, both of Japan

[21] Appl. No.: 276,847

[22] Filed: Jul. 18, 1994

[30] Foreign Application Priority Data

| Jul. 19, 1993 | [JP] | Japan | 5-200023 |
| Aug. 3, 1993 | [JP] | Japan | 5-212214 |
| Aug. 3, 1993 | [JP] | Japan | 5-212215 |

[51] Int. Cl.$^6$ .................................................. G01R 31/02
[52] U.S. Cl. .................... 324/760; 324/754; 324/758; 29/832
[58] Field of Search .................... 324/754, 760, 324/758; 29/832

[56] References Cited

U.S. PATENT DOCUMENTS

| 4,518,914 | 5/1985 | Ohkubo et al. | 324/754 |
| 4,567,433 | 1/1986 | Ohkubo et al. | 324/754 |
| 5,103,557 | 4/1992 | Leedy | 29/832 |
| 5,177,439 | 1/1993 | Liu et al. | 324/754 |
| 5,225,037 | 7/1993 | Elder et al. | |
| 5,325,052 | 6/1994 | Yamashita | 324/754 |

*Primary Examiner*—Kenneth A. Wieder
*Assistant Examiner*—Kourosh Cyrus Khosravi
*Attorney, Agent, or Firm*—Beveridge, Degrandi, Weilacher & Young, LLP

[57] ABSTRACT

A probing device for inspecting semiconductor devices such as IC chips includes a mounting section for supporting a silicon substrate wafer (i.e., an object to be inspected), a moving section for moving a probe card in such a way that contacts formed on a surface of the probe card can be pushed against electrode pads formed on the wafer, and a measuring section. The probe card is formed by joining a silicon nitride ($Si_3N_4$) thin film (whose thermal expansion coefficient is roughly equal to that of the silicon wafer) to a lower surface of a wiring substrate. The wiring substrate is composed of a polyamide thin film (as an insulating layer) and conductive layers (as conductive signal line paths) formed in and on both the surfaces of the polyamide thin film. Further, bumps (contacts) are arranged on the lower surface of the silicon nitride thin film. A plurality of through holes are formed penetrating from the upper surface of the wiring substrate to the lower surface of the silicon nitride film at an area outside the bump arrangement region. These through holes mechanically connect the silicon nitride thin film to the wiring substrate and further electrically connect the bumps to the circumferential portion of the probe card body via the conductive layers. Since the thermal expansion coefficient of the silicon wafer is roughly equal to that of the silicon nitride thin film of the probe card, even when the silicon wafer is heated or cooled for electrical measurements, it is possible to securely keep contact between the contacts (bumps) of the probe card and the electrode pads formed on the IC chips of the wafer without dislocation.

7 Claims, 6 Drawing Sheets

PROBING METHOD AND DEVICE

BACKGROUND OF THE INVENTION

The present invention relates to a probing method and a probing device suitable for use to test semiconductor devices such as IC chips formed on a silicon wafer.

In the manufacturing process of semiconductor devices, after a wafer process has been completed and further IC chips have been completely formed in a silicon wafer, electrical measurements (termed probe test) are effected to examine the presence or absence of shorts or disconnections in formed electrode patterns and the input and output characteristics of the completed IC chips. That is, the acceptance or rejection of the IC chips is discriminated with respect to quality under the condition of the semiconductor wafer (referred to as wafer, hereinafter). After that, the wafer is divided into a plurality of IC chips. Further, the accepted IC chips are packaged, and further subjected to a handler test as to other items to finally determine the acceptance or rejection of the IC chip products.

In the probing device as described above, a wiring substrate (termed probe card) provided with a plurality of needles is used. This probe card has an insulating substrate, on one surface of which a group of contacts is arranged. Further, a plurality of needles (probes) made of tungsten, for instance, are provided on the insulating substrate. One end of each needle is connected to one of the contacts and the other end of each needle extends obliquely from the other surface of the insulating substrate. For an electrical test or inspection, contacts formed in the probe card are electrically connected to electrodes of a test head, and further the needles (probes) are brought into contact with electrode pads formed on the IC chips by moving a wafer mounting base for position matching between the needles and the electrode pads. After that, high frequency test signals equivalent to the operational speed of the IC chips are inputted to the IC chips from the test head through the probe card, and further the test signals outputted from the IC chips are returned to the test head, to electrically test the IC chips on the basis of the signals outputted by the IC chips to be tested.

By the way, recently there exists such a tendency that the semiconductor devices have been microminiaturized and highly integrated more and more, so that the electrode pads of the IC chips are being miniaturized and further the arrangement pitch of the electrode pads is being reduced more and more. At present, the size of the electrode pads is about 70 μm on one side thereof and the tip diameter of the needle is about 30 μm. However, when the electrode pads are further miniaturized and thereby the pitch thereof is further reduced, it is extremely difficult to arrange the needles so as to be brought into contact with the electrode pads.

To overcome the above-mentioned problem, the inventor is now studying the method of forming the probe card as follows: a flexible thin film formed of polyamide resin is used; conductive projections (referred to as bumps) formed of gold 18 carats fine or copper, for instance, are arranged as contacts or needles on one surface of the this flexible film; and a wiring multilayer, connected to the bumps, respectively is formed inside the flexible thin film.

In the probe card formed as described above, it is possible to form microminiaturized bumps on the insulating substrate according to a predetermined arrangement pattern in accordance with the printing technique.

On the other hand, in the case of the burn-in test for previously detecting defective IC chips under severer conditions than usual, the IC chips are so far tested after having been packaged. Recently, however, it has been studied to conduct the burn-in test of the IC chips under the conditions of the wafer. In this case, a temperature adjuster is incorporated in the wafer mounting base, and the wafer is tested under the condition that the test temperature is adjusted within such a wide range as between −40° and +150° C., for instance.

In the case of the above-mentioned probe card, however, since there exists a big difference in coefficient of thermal expansion between the flexible thin film resin (e.g., polyamide, $3.1 \times 10^{-5}$) and the silicon wafer ($2.42 \times 10^{-6}$), in such a sever and wide temperature test from room temperature to 100° C. or higher as described above, the matching positions of the bumps relative to the electrode pads as adjusted at room temperature are easily dislocated markedly within the large temperature range. The change rate of the matching positions between the bumps and the electrode pads increases with increasing area of the wafer, that is, with increasing wafer diameter.

Therefore, even if the bumps are formed on the flexible thin film so as to confront the electrode pads arranged on the wafer at room temperature, since the size of the electrode pads is extremely small and in addition the pitch of the electrode pads is narrow (with the result that the bump size is reduced to that extent), the electrical contact conditions between the bumps and the electrode pads are deteriorated, or the pumps are easily dislocated from the electrode pads at the worst at another higher or lower temperature. In other words, even if the method of forming bumps on the thin film is adopted, there still exists a problem in that it is impossible to perform the test reliably by use of a probing device, due to the recent advance of the device integration rate, microminiaturization, and wafer diameter.

SUMMARY OF THE INVENTION

With these problems in mind, therefore, it is the object of the present invention to provide a probing method and a probing device, by which the contacts (bumps) of a probe card can be reliably kept in contact with the electrode pads of silicon substrate to be tested (an object to be inspected) during electrical test under the conditions that the object to be tested is kept cooled or heated.

To achieve the above-mentioned object, a probing method according to the present invention comprises the steps of: preparing a probe card formed with contacts; connecting the contacts with measuring means; preparing an object to be inspected of silicon substrate having electrode pads; pushing the probe card against the inspected object to bring the contacts into contact with the electrode pads of the inspected object; heating or cooling the inspected object; and measuring the inspected object eclectically by the measuring means, characterized in that the probe card is formed of silicon nitride on at least one surface side thereof facing the inspected object.

Further, a probing device according to the present invention comprises: inspected object mounting means for supporting an object to be inspected of silicon substrate having electrode pads; measuring means; a probe card having contacts electrically connected to said measuring means and arranged so as to face the inspected object; means for moving said probe card relative to the inspected object so that the contacts can be brought into contact with the electrode pads of the inspected object mounted on said inspected object mounting means; means for heating or cooling the inspected object; and wherein said probe card is formed of silicon nitride on at least one surface thereof facing the inspected object.

In the probing method and device according to the present invention, since the thermal expansion coefficient of the silicon wafer is almost equivalent to that of the silicon nitride, even when the probe card is brought into contact with an object to be inspected (i.e., a silicon wafer) and further the silicon wafer is heated or cooled, it is possible to keep the matched positions between the probe card and the silicon wafer as adjusted at room temperature, with the result that it is possible to allow the bumps (contacts) to accurately keep contact with the miniaturized electrode pads arranged on the semiconductor wafer at an extremely small pitch.

DESCRIPTION OF THE PREFERRED EMBODIMENTS

Figure 1:
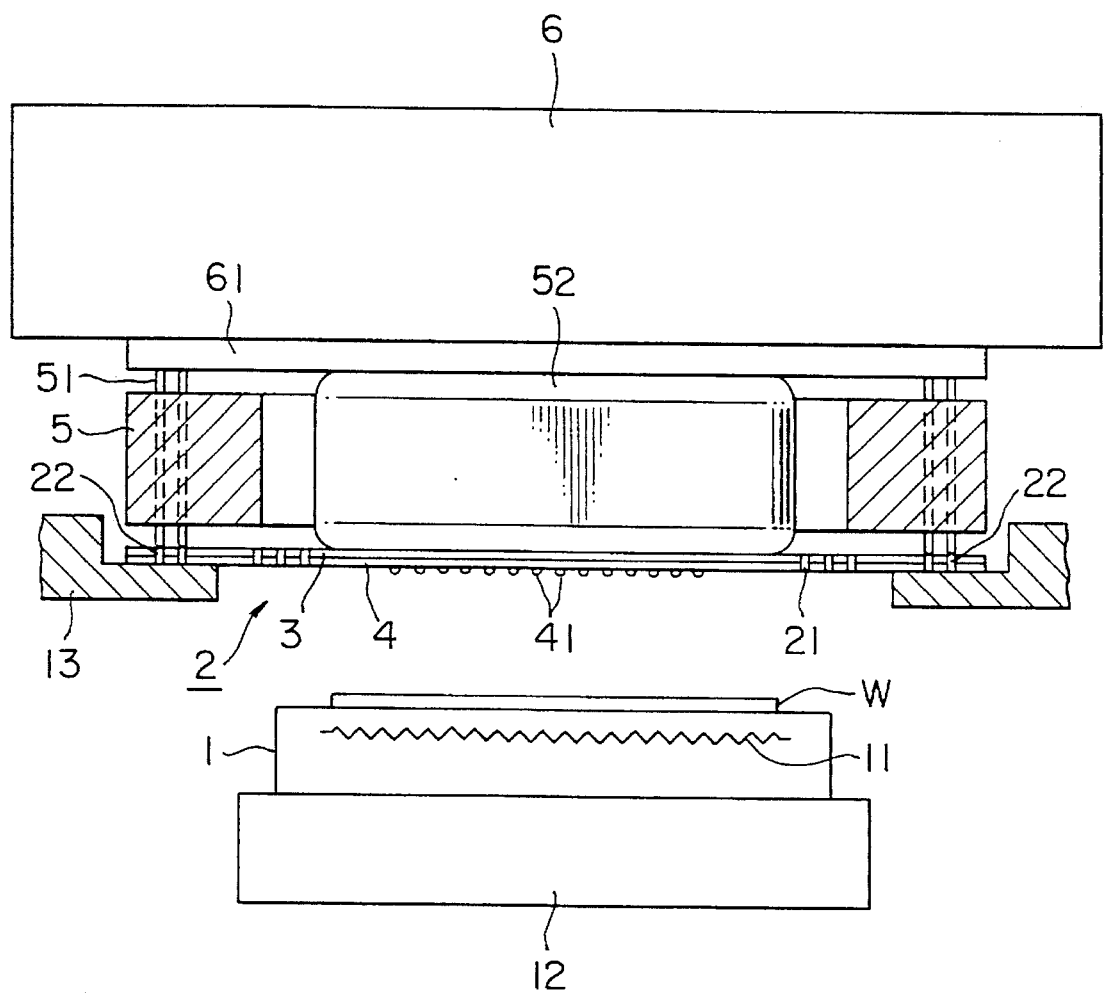
FIG. 1 is a front, partially cross-sectional, view showing an embodiment of the probing device according to the present invention.

In FIG. 1, on a wafer mounting base 1, a heater 11 and temperature adjusting means (not shown) including a cooling medium (refrigerant) passage are arranged. Therefore, the temperature of a wafer W can be adjusted within a range from −40° to +150° C. Further, the wafer mounting base 1 is so constructed as to be moved finely in three axial directions: for instance, X direction in the horizontal plane, Y direction perpendicular to the X direction in the same horizontal direction, and 8 direction about a vertical axis, with a driving mechanism 12. In addition, the wafer mounting base 1 is so constructed so as to be moved in the vertical direction between a wafer inspection position and a wafer mounting and dismounting position.

Figure 2:
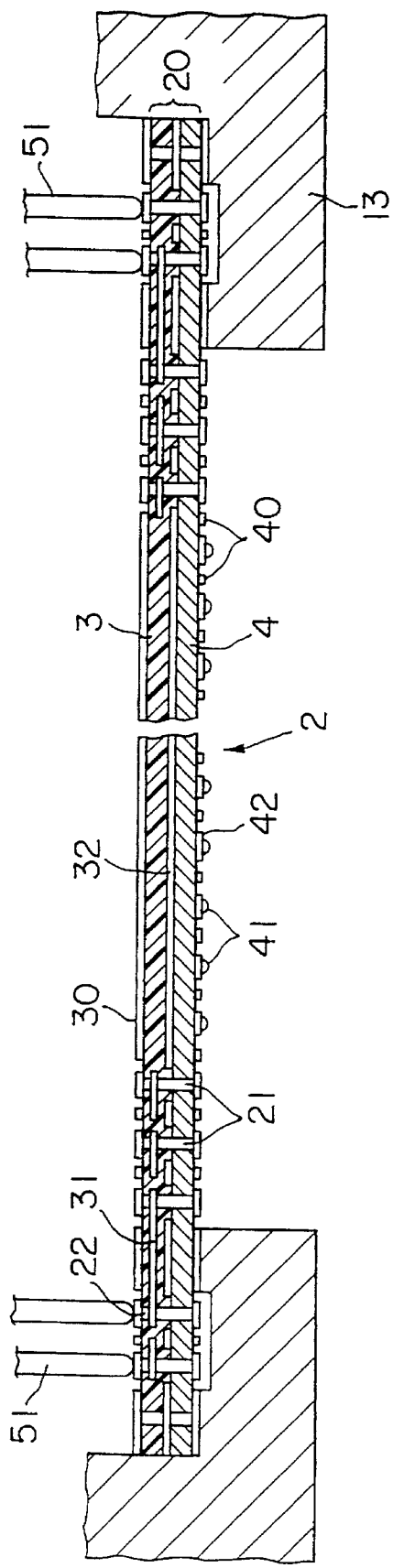
FIG. 2 is an enlarged partially cross-sectional view showing the probing device shown in FIG. 1, together with a probe card.

Over the wafer mounting base 1, a circular probe card 2 is provided so as to confront the wafer mounting base 1. The probe card 2 is supported by a supporting member 13 at the lower circumferential surface thereof. As depicted in FIG. 2, the probe card 2 has a card body 20. This card body 20 is a flexible insulating substrate formed of polyamide thin film, for instance. In this insulating film, there are formed a wiring substrate 3 for forming a conductive layer (described later) and a silicon nitride ($Si_3N_4$) thin substrate 4 formed on the wafer side (the lower side in FIGS. 1 and 2) of the wiring substrate 3. Further, contacts such as bumps of conductive projections 41 are arranged on the lower surface of the $Si_3N_4$ thin substrate 4. These bumps 41 are arranged in corresponding positional relationship with respect to all the electrode pads, so as to be simultaneously brought into contact with the electrode pads of all the IC chips formed on the wafer W. These bumps 41 are formed of gold of 18 carats fine, tungsten, or nickel alloy, for instance.

Further, the card body 20 is formed with signal line through holes or short via holes 21 penetrating from the one surface to the other surface of the card body 20, that is, from the upper surface of the wiring substrate 3 to the lower surface of the $Si_3N_4$ thin substrate 4 and arranged in an outer area outside the bump (41) arrangement region. The holes 21 may be solid instead of being hollow.

The number of these through holes 21 is equal to or more than that of the bumps 41. On the lower surface of the $Si_3N_4$ thin substrate 4, a conductive layer 42 with a thickness of about 20 μm and made of copper or gold is formed to form signal line conductive paths between the exposed ends of the through holes 21 and the bumps 41, respectively. In addition, the probe card 2 or the card body 20 is formed with connecting through holes 22, in the same way as the through holes 21, penetrating from the upper surface to the lower surface of the card body 20 and arranged at the outer circumferential portion thereof. These through holes 21 and 22 are electrically connected to each other via a conductive layer 31 formed inside the wiring substrate 3. Here, it is possible to form a great number of conductive lines on this single conductive layer 31 (as shown in FIG. 2) by reducing the line width as much as possible. However, when the number of the bumps 41 is so large that the conductive lines cannot be formed on a single layer, the conductive layer 31 is formed as a multilayer to increase the number of the conductive lines for connecting these through holes 21 and 22.

Further, on both surfaces of the card body 20, grounding layers 30 and 40 made of copper foil, for instance is formed apart from the through holes 21 and 22 and conductive layer 42, in such a way as to surround these through holes and conductive layer. These grounding layers 30 and 40 are electrically connected to a grounding through hole (not shown) formed in line with the connecting through holes 22, via a ground layer 32 formed on the lower surface of the wiring substrate 3, for instance. This grounding through hole is grounded via an intermediate connecting body and a performance board of a test head (described later). Accordingly, the signal line conductive paths can be electrically shielded by these grounding connection. Further, the thickness of the wiring substrate 3 and the $Si_3N_4$ thin substrate 4 is on the order of about several hundred microns, respectively. Further, in this embodiment, the wiring substrate 3 and the $Si_3N_4$ thin substrate 4 are both fixed locally by these through holes 21 and 22, respectively.

As shown in FIG. 1, an annular intermediate connecting body 5 is arranged over the probe card 2. Further, over the intermediate connecting body 5, a test head 6 having a wiring substrate 61 at the lower surface side thereof is arranged as a part of the measurement section. At the circumferential portion of the intermediate connecting body 5, conductive axles (referred to as pogo pins) 51 always urged in the projecting direction are provided so as to project upward and downward at the positions corresponding to the connecting through holes 22. The lower ends of these pogo pins 51 are in contact with the upper ends of the through holes 22 and the upper ends of these pogo pins 51 are in contact with the contacts (not shown) of the wiring substrate 61 of the test head 6, respectively. As described above, the bumps 41 of the probe card 2 are electrically connected to the test head 6 by way of the conductive layers 42 and 31 formed in the probe card 2, the through holes 21 and 22 and the intermediate connecting body 5.

Further, a damping body 52 (e.g., an air mat or a rubber body) of compressive state is interposed in the central space of the annular intermediate connecting body 5, that is, between the probe card 2 and the wiring substrate 61 of the test head 6, so that the card body 20 can be pressed in the downward direction thereof.

The function of the above-mentioned embodiment of the probing device according to the present invention will be described hereinbelow. First, an object to be inspected of silicon substrate (e.g., wafer W) is mounted on the wafer mounting base 1. After that, an optical position detecting instrument (not shown) is inserted between wafer mounting base 1 and the probe card 2, and further the wafer mounting base 1 is moved in the three directions of X, Y and θ, respectively with the use of the driving mechanism 12 to adjust the position of the wafer W relative to the probe card 2 for position matching. Successively, the wafer mounting base 1 is raised to bring all the electrode pads of all the IC chips formed on the wafer W into contact with the bumps 41 arranged on the probe card 2 simultaneously. In this case, since the bumps 41 can be connected to the chip electrode pads under the urged conditions caused by a restoring force of the damping body 52, it is possible to realize a reliable electrical contact between the bumps 41 and the electrode pads. After that, the heater 1 is turned on to heat the wafer W up to 80° to 150° C., for instance. Further, predetermined test pulse signals are applied from the test head 6 to the IC tips on the wafer W, and the test pulse signals transmitted from the IC chips are returned to the test head 6, in order to discriminate whether the IC chips are acceptable or not.

In the above-mentioned embodiment, since the wafer W is located in a close vicinity of the probe card 2, heat of the wafer W is inevitably transmitted from the wafer W to the probe card 2 directly via the bumps 41 or indirectly by radiation. Therefore, the temperature of the probe card 2 reaches almost the same temperature as that of the wafer W. In this embodiment, however, since the coefficient of the thermal expansion of the silicon is $2.42 \times 10^{-6}$ and that of the $Si_3N_4$ thin substrate 4 is $2.5 \times 10^{-5}$; that is, there exists no big difference between the two, the silicon wafer W and the $Si_3N_4$ thin substrate 4 expand due to heat both at almost the same rate. Further, although the wiring substrate 3 formed on the $Si_3N_4$ thin substrate 4 is a polyamide film and therefore the coefficient of the thermal expansion of this polyamide is $3.1 \times 10^{-5}$ (which is larger than that ($2.42 \times 10^{-6}$) of the $Si_3N_4$ thin substrate 4), since the polyamide wiring substrate 3 is locally fixed to the $Si_3N_4$ thin substrate by the through holes 22 and 24 respectively, even if the wiring substrate 2 is deformed into a convex shape in the upward direction, the $Si_3N_4$ thin substrate 4 is not subjected to the influence of distortion of the polyamide film 3 due to the difference in thermal expansion coefficient between the two 3 and 4.

Accordingly, the dislocation rate of the electrode pads on the wafer W is almost equivalent to that of the bumps 41 on the probe card 2. As far as the probe card position is adjusted relative to the wafer position at room temperature, even after the wafer and the probe card, brought into contact with each other, have been heated together up to a high temperature, it is possible to keep the reliable mutual positional relationship with respect to each other. Therefore, even if the minute electrode pads are arranged on the wafer W at an extremely small pitch, it is possible to keep the contact between the electrode pads and the bumps under an accurate positional condition. As a result, the probing device according to the present can cope with the higher integration and higher microminiaturization of the wafer W. In addition, since the dislocation between the electrode pads and the bumps is small even within a wide inspection area, it is possible to cope with the larger diameter of the wafer W. Further, when the probe card 2 is composed of the wiring substrate 3 and the $Si_3N_4$ thin substrate 4, there exists such an advantage that it is possible to freely select the thin film material of the wiring substrate 3 so as to be suitable for the single layer or the multilayer (a polyamide film is used in the above-mentioned embodiment).

Further, in this embodiment, it is also possible to provide the temperature adjusting means including the heater on the probe card side. In this case, the positions of the wafer W and the probe card 2 are matched with respect to each other, under the conditions that both are heated (or cooled) independently.

Further, in the above-mentioned embodiment, the conductive layers 31 and 42 are formed on both sides of the probe card substrate (the films 3 and 4 in FIG. 2) as the conductive paths of the probe card 2. Without being limited thereto, however, it is also possible to form the conductive paths from the bumps 41 to the intermediate body 5 by use of only the printed wires formed on the surface of the probe card substrate and the through holes.

Figure 3:
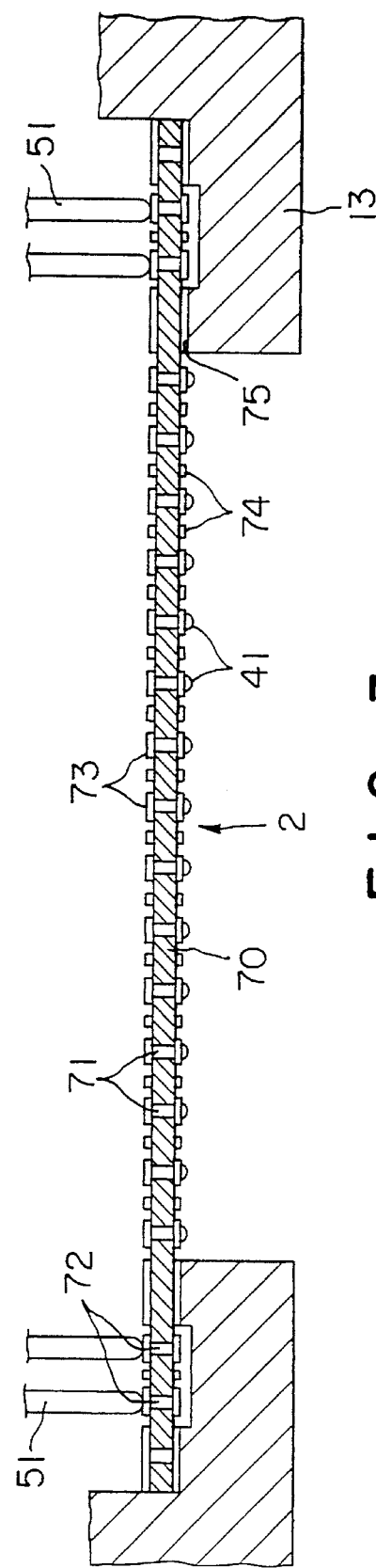
FIG. 3 is an enlarged cross-sectional view showing a modification of the probe card shown in FIG. 2.

FIG. 3 shows another embodiment as described above. In this embodiment, the substrate of the probe card 2 itself is formed of only a $Si_3N_4$ thin film 70; the respective bumps 41 are formed at the lower ends of the through holes or short via holes 71 for signal lines; and conductive paths 73 are formed by printed wires extending from the through holes 71 to connecting through holes 72 formed at the circumferential portion of the probe card 2. In FIG. 3, the grounded layers are denoted by 74 and 75, respectively. In this embodiment, since the wafer W and the probe card 2 expand to the same extent at the high temperature, it is possible to obtain the same function and the same effect as already explained above with reference to FIGS. 1 and 2.

In the probing device according to the present invention, without being limited to only the high temperature test, the same effect can be obtained even at the low temperature test. Further, without being limited to only the above-mentioned embodiment in which the bumps are arranged so as to be brought into contact with all the electrode pads of all the IC chips formed on the wafer, it is also possible to arrange the bumps in correspondence to the electrode pads of a single IC chip or a plurality of IC chips formed on the wafer.

Further, with respect to the connection between the probe card and the test head, without use of the annular intermediate connecting body, it is also possible to adopt such a structure that a plurality of connecting through holes are formed at the circumferential portion of the probe card (as in the above-mentioned embodiment); the bumps (contacts) are formed on the upper or lower ends of the connecting through holes; and the bumps are connected to a connector attached to an end of a cable extending from the test head. Further, it is also possible to use a flat connector terminal mated with the circumference of the probe card.

As described above, in the probing device according to the present invention, in order to effect the electrical test of an object (silicon substrate) to be inspected, the substrate formed on at least the inspected object side of the probe card is made of $Si_3N_4$ whose thermal expansion coefficient is almost equivalent to that of the silicon, when the inspected body and the probe card are heated or cooled, the mutual positional dislocation of the contacts (bumps) formed on the probe card side relative to the electrode pads formed on the inspected object can be minimized, with the result that it is possible to securely keep contact between the electrode pads and the probe card contacts, even if the minute electrode pads are arranged on the inspected object at a small pitch.

By the way, at the connecting portion between the probe card 2 and the wiring substrate 61 of the test head 6; that is, at both contact ends of the pogo pins 51, the signal terminals and the grounding terminals must be kept away from each other, so that appropriate gaps must be formed between the two, with the result that a high impedance portion is inevitably formed at these portions.

On the other hand, recently there exists such a tendency that the device integration rate and the device operating speed have been both increased more and more, so that it is expected that the frequency of the device testing signals increases up to as high as 1 GHz. Therefore, in the case where the impedance of the conductive paths relative to the ground is high, since the waveforms of the test pulse signals are distorted, there exists a problem in that a precise electrical test is difficult or disabled.

Further, when the pogo pins are used, since there exists a contact resistance between each end of the pogo pins and each of the electrodes or since there are many contact portions due to the combination with springs and balls, the total contact resistance is relatively large, with the result that there exists another problem in that a predetermined pulse waveform cannot be obtained. In addition, since the signal pogo pins and the grounding pogo pins are used in the form of pairs, the area occupied by a single pogo pin is relatively large, thus raising another problem in that it is difficult to mount the necessary elements on the probe card at a high density.

Another embodiment of the probing device according to the present invention which can solve the above-mentioned problems will be described hereinbelow with reference to FIGS. 4 to 6.

Figure 4:
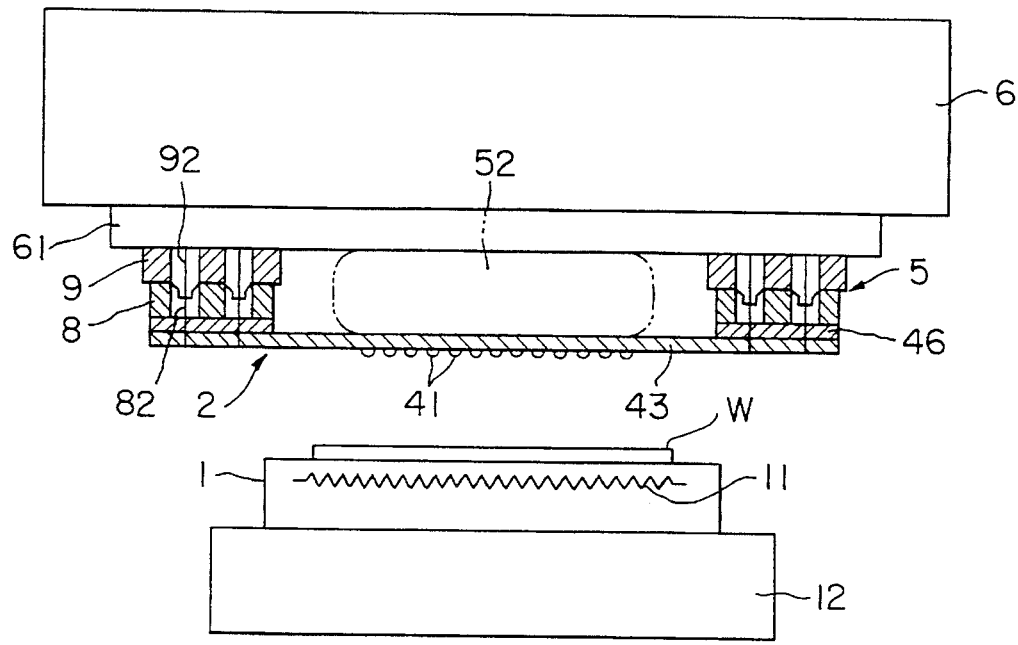
FIG. 4 is a front, partially cross-sectional view showing another embodiment of the probing device according to the present invention.
Figure 5:
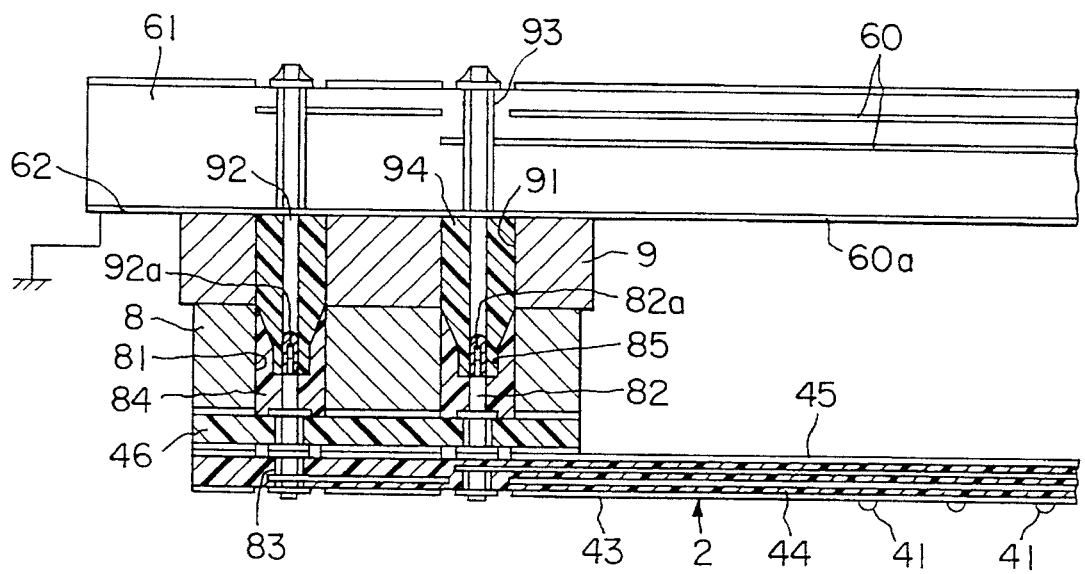
FIG. 5 is an enlarged partially cross-sectional view showing the probing device shown in FIG. 4, together with a probe card and intermediate connecting bodies.

In FIG. 4, the same reference numerals have been retained for similar parts or elements which have the same functions as with the case of the embodiment shown in FIGS. 1 to 3. Over a wafer mounting base 1, a circular probe card 2 is provided so as to confront the wafer mounting base 1. The probe card 2 is removably attached to a test head 6 via an intermediate connecting (aluminum block) body 5 (described later). The probe card 2 is composed of a flexible multilayer wiring substrate 43 formed of polyamide, for instance and conductive projection bumps (i.e, contacts) 41 arranged on the lower surface of the multilayer wiring substrate 43. In this embodiment, the probe card 2 is also formed of silicon nitride at least on the lower surface side facing the wafer W, in the same way as with the case of the embodiment shown in FIGS. 2 and 3.

These bumps 41 are also arranged in corresponding positional relationship with respect to all the electrode pads, so as to be simultaneously brought into contact with the electrode pads of all the IC chips formed on the wafer W. These bumps 41 are formed of gold of 18 carats fine, tungsten, or nickel alloy, for instance. As shown in FIG. 5, in the multilayer wiring substrate 43, a number of wiring layers 44 used as conductive paths are laminated, and a plurality of grounding layers 45 are formed on both upper and lower surfaces of the multilayer wiring substrate 43 and between the two adjacent wiring layers 44.

To the circumferential portion and on the upper surface side of the probe card 2, a first annular conductive block body 8 formed of aluminum, for instance is jointed. This first block body 8 is formed with a number of through holes 81 passing from the upper surface to the lower surface thereof. Further, in this embodiment shown in FIG. 5, a reinforcing insulating substrate 46 on both surfaces of which are covered with copper foil is interposed between the multilayer wiring substrate 43 and the first block body 8.

Into each of these through holes 81, a conductive axle 82 whose diameter is smaller than that of the through hole 81 is inserted coaxially with respect to the through hole 81 so as not to be in contact with the inner circumferential wall of the through hole 81. The lower end of the conductive axle 82 is passed through the multilayer wiring substrate 43 and slightly projects from the lower surface of the substrate 43. The multilayer wiring substrate 43 is formed with through holes 83 whose inner circumferential walls are covered with a metallic (e.g., copper) foil. The conductive axle 82 is also passed through the through hole 83 formed in the multilayer wiring substrate 43. The lower end of the conductive axle 82 is soldered to the metallic foil of the through hole 83 of the multilayer wiring substrate 43. These through holes 83 are arranged so as to correspond to the bumps 41 in number, so that it is possible to electrically connect the bumps 41 to the conductive axles 82, respectively through the wiring layers 44 formed in the multilayer wiring substrate 43.

Figure 6:
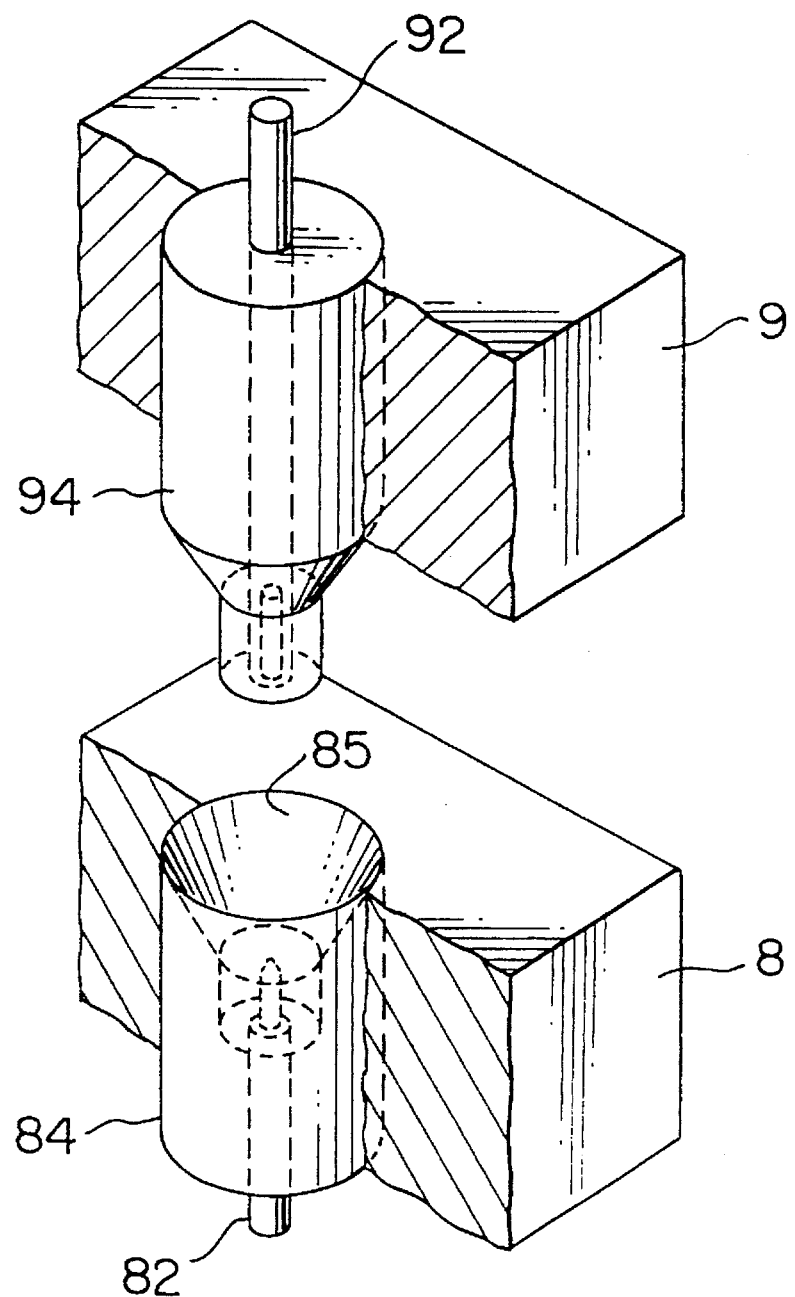
FIG. 6 is a perspective, partially broken, view showing a part of the probing device shown in FIG. 5.

As depicted in FIG. 6, in a space between the through hole 81 and the conductive axle 82, an insulating body 84 formed of an insulating material (e.g., polypropylene) is interposed. This insulating body 84 is formed into such a female shape that a concave portion 85 is formed by combination of both a reverse conical shape and a cylindrical shape. Further, the conductive axle 82 is formed into such a male shape that the upper end portion thereof projects within the concave portion 85 of the insulating body 84 and the tip thereof is mated with another conductive axle 92 (described later). By forming the coaxial structure as described above, it is possible to carry out the impedance matching of the high frequency test signals used for probing test, so that the high frequency characteristics of the probing device can be further improved.

On the other hand, as shown in FIG. 4, over the probe card 2, a test head 6 serving as a part of the measurement section is supported by a supporting mechanism (not shown). On the lower surface side of the test head 6, a wiring substrate 61 formed of an insulating material such as glass or epoxy resin is provided so as to face the probe card 2. This wiring substrate 61 is provided with a plurality of wiring layers 60 (see FIG. 5) and grounding layers (not shown) in the same way as with the case of the multilayer wiring substrate 43 of the probe card 2.

To the lower surface of the wiring substrate 61, a second annular conductive block body 9 formed of aluminum, for instance is jointed at such a position as to face the first block body 8. The junction surface between the first and second block bodies 8 and 9 and the other junction surfaces between the first block body 8 and the probe card 2 and between the second block body 9 and the wiring substrate 61 are all plated with gold. Further, the block body (9) side of the wiring substrate 61 is covered with copper foil which is grounded.

In the same way as with the case of the first block body 8, this second block body 9 is formed with a number of through holes 91 in corresponding positional relationship with respect to the through holes 81 of the first block body 8. Into each of the through holes 91, a similar conductive axle 92 and a similar insulating body 94 are inserted. The upper end of the conductive axle 92 is passed through a through hole 93 of the wiring substrate 61 and then soldered. The insulating body 94 is of male shape mated with the insulating body 84 of female shape on the first block body (8) side. Further, the lower end of the conductive axle 92 is of female shape mated with the conductive axle 82, as already explained.

The function of the above-mentioned embodiment will be described hereinbelow. First, the probe card 2 is attached to the lower surface side of the wiring substrate 61 of the test head 6. In this attachment, the first block body 8 and the second block body 9 are opposed to each other, and further the cylindrical insulating bodies 84 and 94 (in FIG. 6) interposed in the through holes 81 and 91 are mated with each other. By this mating, it is possible to mate the conductive axles 82 and 92 with each other securely for electrical connection. Further, both the block bodies 8 and 9 are brought into surface contact with each other. In this case, although the conductive axles 82 and 92 are both enclosed by the block bodies 8 and 9, since both the block bodies 8 and 9 are grounded, the conductive axles 82 and 92 can be electrically shielded. In addition, the bumps 41 are electrically connected to the test head 6 via these conductive axles 82 and 92, respectively.

After that, a wafer W (an object to be inspected) is mounted on the wafer mounting base 1. Further, an optical position detecting instrument (not shown) is inserted between wafer mounting base 1 and the probe card 2, and the wafer mounting base 1 is moved in the three directions of X, Y and θ with the use of the driving mechanism 12 to adjust the matching position of the wafer W relative to the probe card 2. Successively, the wafer mounting base 1 is raised to bring all the electrode pads of all the IC chips formed on the wafer W into contact with the bumps 41 arranged on the probe card 2 at the same time. In this case, when the bump (41) arrangement area is pushed from above by an appropriate pushing means such as springs or a damping body 52 (e.g., air mat or rubber body as shown by dot-dashed lines in FIG. 4), since the bumps 41 can be connected to the chip electrode pads under the urged conditions caused by a restoring force of the damping body 52, it is possible to realize a more reliable electrical contact between the bumps 41 and the electrode pads. After that, predetermined test pulse signals are applied from the test head 6 to the IC chips on the wafer W, and the test pulse signals transmitted from the IC chips are received by the test head 6, in order to discriminate whether the IC chips are acceptable or not.

In this embodiment, since the probe card 2 and the wiring substrate 61 disposed on the side of the test head 6 are electrically connected to each other in perfect coaxial positional relationship with respect to each other with the use of the conductive axles 82 and 92, it is possible to keep constant the impedance of the conductive paths relative to the ground, with the result that the waveforms of the high frequency test signals of 1 GHz or higher are not distorted without being susceptible to the influence of the external noise. In addition, since the conductive axles 82 and 92 are all inserted into the through holes 83 (of the multilayer wiring substrate 43) and 93 (of the wiring substrate 61) for connection between the respective wiring layers 44 of the probe card 2 and the respective wiring layers 60 of the wiring substrate 61 and further since the conductive axles 82 and 92 are both mated with each other on the basis of coaxial male and female connection relationship, it is possible to reduce the contact resistance between these connection portions markedly, as compared with the conventional probing device which uses pogo pins. As a result, when the IC chips are inspected by use of high frequency test pulse signals, high precise electrical measurements can be realized, thus coping with the test of the semiconductor IC chips whose operating speed is increasing more and more.

Further, since the conductive axles 82 and 92 are enclosed by the block bodies 8 and 9 formed of aluminum, it is unnecessary to fit a shielding electrode to the outer circumference of each of the conductive axles, individually, thus reducing the area required for one pin (one axle) of the block bodies 8 and 9 and thereby allowing a high density pin arrangement on the probe card. When the bumps are brought into contact with all the electrode pads of all the IC chips formed on the wafer W simultaneously, since the number of the bumps is large, the structure of the above-mentioned embodiment is very advantageous. In addition, when both the block bodies 8 and 9 are joined to each other by mating the insulating bodies 84 and 94 one another, it is possible to automatically locate the probe card 2 relative to the wiring substrate 61.

In the above-mentioned description, without being limited to only the bumps, it is also possible to use needles made of tungsten as the contacts of the probe card. Further, without being limited to only the contacts connectable to the electrode pads of all the IC chips formed on the wafer simultaneously, it is also possible to use contacts of such a type as to be brought into contact with a part of the electrode pads of the IC chips in sequence.

Further, the block bodies can be made of a metal other than aluminum, or else it is also possible to use the block bodies made of a conductive plastic or of an insulating body covered with a metallic foil. Further, in the above-mentioned embodiment, the block body disposed between the probe card 2 and the wiring substrate 61 of the test head 6 is divided into two. Without dividing the block body, it is also possible to adopt such a construction that the block body is fixed to one of the probe card and the wiring substrate in such a way as to be separable from the other of them.

In the above-mentioned embodiment, the conductive block bodies 8 and 9 are interposed between the probe card 2 and the wiring substrate 61 of the test head 6, in such a way as to be brought into contact with the substrate surfaces of the probe card 2 and the wiring substrate 61. Further, the probe card 2 and the wiring substrate 61 are electrically connected to each other by the coaxial connecting structure provided in the block bodies. Accordingly, the conductive paths can be shielded without forming any gaps, so that it is possible to keep constant the impedance of the conductive paths relative to the ground, with the result that high precise electrical measurements and inspections can be realized for the semiconductor IC chips of high operating speed on the basis of high frequency test pulse signals.

FIGS. 7 to 9B show another embodiment of the probing device according to the present invention, in which means for securing the electrical contact between the bumps and the electrode pads is additionally provided; that is, the contacts of the probe card (i.e., bumps) can break through an oxide film formed naturally on the electrode pads formed on the wafer W (an object to be inspected).

In this embodiment, the same reference numerals have been retained for the similar parts or elements which have the same functions as with the case of the afore-mentioned embodiments, without repeating any detailed description thereof. However, only the points different from the aforementioned embodiments will be explained in detail hereinbelow.

Figure 7:
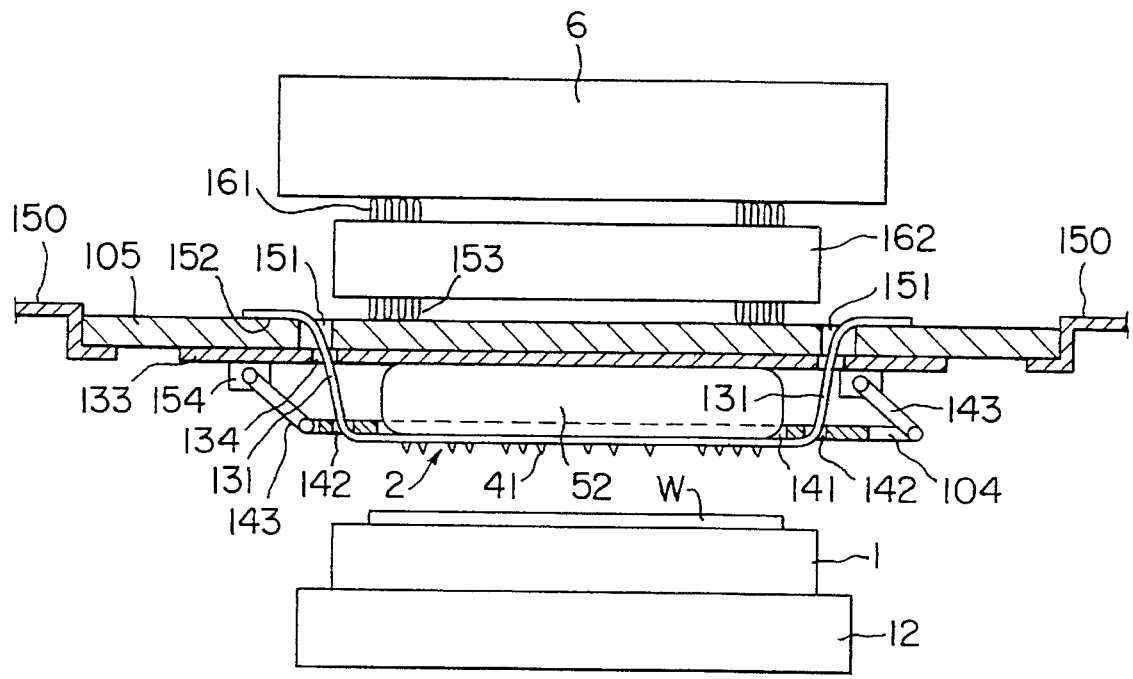
FIG. 7 is a front, partially cross-sectional, view showing another embodiment of the probing device according to the present invention.

In FIG. 7, over the probe card 2, a plate 104 movable in the horizontal direction is disposed. This movable plate 104 is formed with a square-shaped cutout portion 141 at the middle portion thereof in such a range as to cover the arrangement area of bumps 41. Further, the movable plate 104 is formed with two slots 142 each having a length almost equivalent to the front-rear width (in a direction perpendicular to paper in FIG. 7) of the cutout portion 141, on both sides of the cutout portion 141. In addition, over the movable plate 104, a printed circuit board 105 having a reinforcing plate 133 on the lower surface of the board 105 is fixed to an outer frame 150 of a device body (not shown). The reinforcing plate 133 is formed with two slots 134 on both sides thereof at positions slightly outward from the slots 142 formed in the movable plate 104. In the same way, the printed circuit board 105 is formed with two slots 151 on both sides thereof at positions further slightly outward from the slots 142 and 134 formed in the movable plate 104 and the reinforcing plate 133, respectively.

The probe card 2 is fixed to the lower surface of the movable plate 104 in such a way that the bump (41) arrangement area can face the cutout portion 141 formed in the movable plate 104. Further, both the right and left flexible ends 131 of the probe card 2 are passed through the slots 142 formed in the movable plate 104, through the slots 134 formed in the reinforcing plate 133 and further through the slots 151 formed in the printed circuit board 105, respectively; turned in the outward direction on both sides thereof; and then fixed to the upper surface of the printed circuit board 105, as depicted in FIG. 7. Both the end portions 131 of the probe card 2 are each a multilayer wiring substrate having a number of layers laminated as conductive paths electrically connected to the bumps 41, respectively. In the multilayer wiring substrate, grounding layers set to a ground potential are formed on both the upper and lower surfaces thereof and interposed between the respective wiring layers. The outer end contacts (not shown) of these wiring layers and the grounding layers are connected to contacts 152 formed on the printed circuit board 105.

Further, over the printed circuit board 105, a contact ring 162 is disposed as an intermediate connecting body. The contact ring 162 is provided with a plurality conductive pins (referred to as pogo pins) 161 extensibly projecting in the vertical direction. The lower ends of these pogo pins 161 are in contact with electrodes 153 electrically connected to the contacts 152 of the printed circuit board 105 via printed wires, and the upper ends of these pogo pins 161 are in contact with electrodes (not shown) of a test head 6 disposed over the contact ring 162. Owing to these conductive paths, the test head 6 can be connected to the bumps 41 electrically by way of the pogo pins 161, the printed circuit board 105, and the multilayer wiring substrate 131, respectively.

A link mechanism having link arms 143 is provided between a mounting frame 154 attached to the lower surface of the reinforcing plate 133 and the movable plate 104. These link arms 143 are pivotally supported on the upper ends thereof by the mounting frame 154 and on the lower ends thereof by the movable plate 104, respectively. Therefore, the link arms 143 can be moved along a circular arc locus described around two axes arranged in parallel to each other on the surface of the wafer W and expanding toward the wafer mounting base (1) side, under the condition that the movable plate 104 is kept horizontally positioned.

Figure 9A:
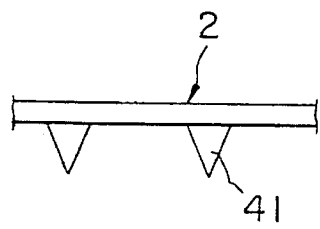
FIG. 9A is an illustration showing one shape of the bumps.
Figure 9B:
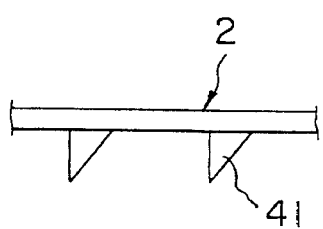
FIG. 9B is an illustration showing another shape of the bumps.
Figure 8:
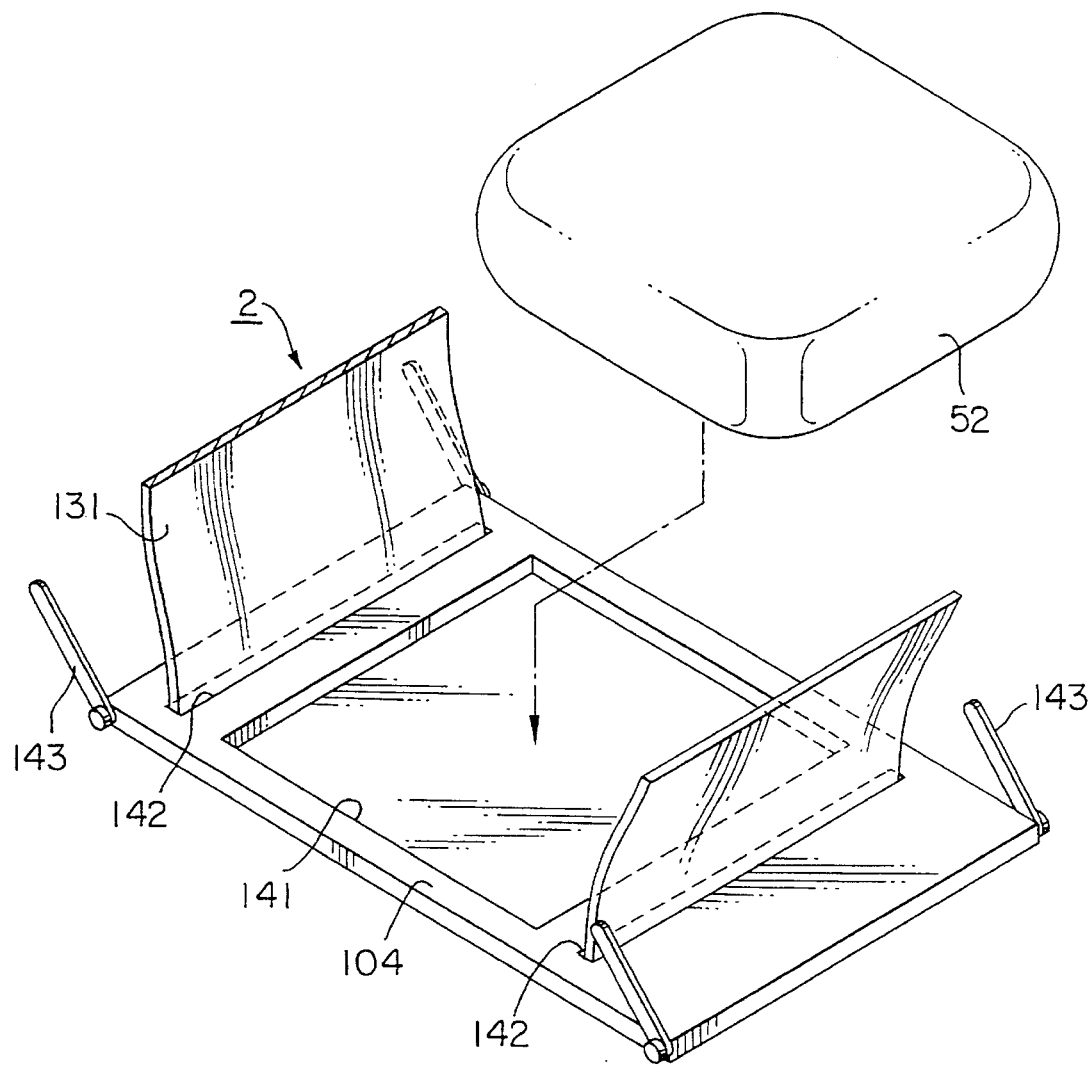
FIG. 8 is an enlarged perspective view showing a mechanism shown in FIG. 7.

To keep the probe card 2 away from the wafer W, the link arms 143 are kept at the oblique status (the movable plate 104 is shifted to either side), as shown in FIG. 7. In this case, the clockwise pivotal motions of the link arms 143 about the mounting frame 154 are stopped by an appropriate stopper (not shown). Further, over the bump (41) arrangement area of the probe card 2, there is provided damping means for urging the bumps 41 against the wafer W via the flexible multilayer wiring substrate 131, that is, a damping body 52 such as an air bag or a rubber mat fit between the probe card 2 and the printed circuit board 105. Further, the shape of the bumps 41 can be modified as shown in FIGS. 9A and 9B.

The function of the probing device as described above will be described hereinbelow. First, an object to be inspected (e.g., wafer W) is conveyed onto the wafer mounting base 1 with the use of conveying arms (not shown) and lift pins (not shown) incorporated within the wafer mounting base 1. After that, the horizontal positions of the probe card 2 and the wafer W are matched by inserting an optical detecting unit between the probe card 2 and the wafer W and by adjusting the X, Y and θ directions of the wafer mounting base 1 on the basis of the images detected by the optical detecting unit. The optical detecting unit can detect both the images of the surface of the wafer W and the bump (41) arrangement surface of the probe card 2 at the same time.

Further, the wafer mounting base 1 is raised to bring the electrode pads of all the IC chips formed on the wafer W into contact with all the bumps 41 simultaneously. In this case, when the wafer mounting base 1 is further raised, since the damping body 52 is pressed, the bumps 41 pushes the electrode pads of the wafer W via the flexible multilayer substrate 131 by a restoring force of the damping body 52. In this case, since the movable plate 104 is moved both in the vertical and horizontal directions through the link mechanism 143, the bumps 41 are shifted in the horizontal direction being rubbed with the electrode pads. Therefore, the electrode pads of the wafer W are electrically connected to the test head 6 via the bumps 41 by way of the already explained passage. Under these conditions, a predetermined supply voltage and test pulse signals are applied from the test head 6 to the IC chips formed on the wafer W, and further the signals outputted by the test head 6 are received by the test head 6 to discriminate whether the IC chips are acceptable or not.

In the probing device according to the present invention, after the bumps 41 has been brought into contact with the electrode pads, since the bumps 41 are shifted in the horizontal direction under the condition that the surfaces of the electrode pads are pushed by the bumps 41, an oxide film naturally formed on each surface of each electrode pad can be rubbed off and further broken away, so that it is possible to bring the bumps into reliable contact with the metal surfaces (e.g., aluminum surface) of the electrode pads, thus enabling highly precise measurements on the basis of the further reliable electric contact between the bumps 41 and the electrode pads formed on the wafer W.

In the above description, as the mechanism for moving the probe card 2 horizontally under the condition that the wafer W is being pushed downward by the probe card 2, another driving mechanism other than above can be used such that a hard plate is disposed on the upper surface of the multilayer wiring substrate 131 (remote from the bumps 41) and, after the bumps 41 are brought into contact with the wafer W, the link arms 143 are pivoted clockwise by another driving mechanism. Alternatively, it is also possible to support and move the wafer mounting base 1 by the similar link mechanism, instead of moving the probe card 2. Further, without providing any link mechanism, it is also possible to provide another mechanism for moving the wafer mounting base 1 and the probe card 2 both in the horizontal direction relative to each other. Further, it is also possible to move the wafer mounting base 1 and the wafer W together relative to the bumps 41 in the X, Y or θ direction, by use of the driving mechanism 12 of the wafer mounting base 1, after the wafer W have been brought into contact with the bumps 41.

Furthermore, without being limited to only the probe card 2 such that the bumps 41 are brought into contact all the electrode pads of the wafer W simultaneously, it is possible to use the probe card 2 of partial multi-contact type such that the bumps are brought into contact with a part of the electrode pads. In this case, it is preferable to move the wafer mounting base 1 in such a way that each group of the bumps 41 can be brought into contact with each group of the electrode pads in sequence. Further, the above-mentioned principle can be applied to the probing devices of another type such that the wafer mounting base is arranged in the vertical direction, without being limited to the probing device provided with the horizontal wafer mounting base.

What is claimed is:

1. A probing device, comprising:

object mounting means for supporting an object to be inspected, having a silicon substrate with electrode pads;

measuring means;

a probe card having contacts electrically connected to said measuring means and arranged so as to face said object, said probe card being formed of silicon nitride at at least one surface thereof facing said object;

supporting means for supporting a circumferential portion of said probe card;

a wiring substrate connected to said measuring means and provided so as to face the probe card supported by said supporting means;

connecting conductor means provided in a circumferential portion of the probe card and electrically connected to said contacts;

means for moving said mounting means relative to said probe card so that the contacts can be brought into contact with the electrode pads of the object mounted on said mounting means;

means for changing the temperature of the object;

interim connecting means for electrically connecting said connecting conductor means to said wiring substrate, said interim connecting means including a first connecting means provided on a side of said probe card and a second connecting means provided on a side of the wiring substrate, said first and second connecting means being removably connected to each other, said first connecting means including a first block body formed with a first through hole, said second connecting means including a second block body formed with a second through hole which is coaxial with said first through hole;

a first hollow insulating member fitted in said first through hole;

a second hollow insulating member fitted in said second through hole; and a first conductive axle extending through said first insulating member and electrically connected to said connecting conductor means;

a second conductive axle extending through said second insulating member and electrically connected to said wiring substrate; and said first and second conductive axles having mutually adjoining ends that are separably connected.

2. The probing device of claim 1, wherein one of said mutually adjoining ends of the first and second conductive axles has a male shape and the other has a female shape, and the adjoining ends are joined removably by a male-female engagement.

3. The probing device of claim 1, wherein said first and second insulating members have adjoining ends, respectively, one of the adjoining ends having a male shape and the other having a female shape, the male and female shapes being removably fitted.

4. The probing device of claim 1, wherein said probe card is composed of a wiring substrate and a silicon nitride substrate fixed to the wiring substrate on the surface side thereof facing the inspected object; and the wiring substrate is formed with an insulating substrate and a conductive layer formed in parallel to a surface of the insulating substrate.

5. The probing device of claim 1, wherein the insulating substrate is flexible.

6. The probing device of claim 1, wherein the contacts are arranged on a surface of the silicon nitride substrate and connected to the conductive layer electrically.

7. The probing device of claim 1, wherein said probe card includes at least one ground layer.

* * * * *